United States Patent [19]
Bonneville

[11] Patent Number: 5,729,611
[45] Date of Patent: Mar. 17, 1998

[54] LOUDSPEADER OVERLOAD PROTECTION

[76] Inventor: Marc Etienne Bonneville, 13 Parkwood Crescent, Gloucester, Ontario, Canada, K1B 3J5

[21] Appl. No.: 788,580

[22] Filed: Jan. 24, 1997

Related U.S. Application Data

[60] Provisional application No. 60/011,416, Feb. 2, 1996.

[30] Foreign Application Priority Data

Feb. 7, 1996 [CA]  Canada .................................. 2169029

[51] Int. Cl.$^6$ .............................. H03G 11/00; H04R 3/00
[52] U.S. Cl. .................................. 381/55; 381/96; 381/59
[58] Field of Search ................................ 381/55, 59, 96

[56]     References Cited

U.S. PATENT DOCUMENTS 4,583,245   4/1986   Gelow et al. ................................ 381/59
4,980,920  12/1990   Noro et al. ................................ 381/96

*Primary Examiner*—Forester W. Isen
*Attorney, Agent, or Firm*—Thomas Adams

[57]     ABSTRACT

In a loudspeaker of the kind in which negative feedback derived by monitoring actual displacement of the loudspeaker's electroacoustic transducer or cone is used to compensate for transducer non-linearities, overload protection is provided by two variable gain amplifiers between the audio input and the power amplifier. One variable gain amplifier is within the feedback loop and the other variable gain amplifier precedes the feedback loop. A detection circuit has two thresholds close to but below the level at which clipping will begin. A first threshold level is about 1.0 dB below and the second threshold level is about 0.5 dB below. A first control signal to reduce the gain of the variable gain amplifier preceding the loop is generated when the first, lower threshold level is exceeded and causes the gain of the amplifier to decrease at a relatively slow rate. A second control signal to reduce the gain of the amplifier within the loop is generated when the higher threshold level is exceeded and reduces the gain of the amplifier within the loop very rapidly so that clipping is avoided. The first and second control signals may each be derived by a threshold amplifier and a charging circuit, the first charging circuit having a longer time constant than the time constant of the second charging circuit. Once the overload situation is under control, i.e. the signal is below the second threshold level, the second control signal increases the gain of the amplifier inside the loop, restoring full feedback. The feedback path may derive a first feedback signal component substantially proportional to the position of the electroacoustic transducer, a second feedback signal component substantially proportional to the velocity of the electroacoustic transducer and a third feedback signal component substantially proportional to acceleration of the electroacoustic transducer.

4 Claims, 2 Drawing Sheets

LOUDSPEADER OVERLOAD PROTECTION

BACKGROUND OF THE INVENTION

This application is based on Provisional Application 60/011,416, filed on Feb. 2, 1996.

TECHNICAL FIELD

The invention relates to loudspeakers, especially loudspeakers which use negative feedback derived by monitoring actual displacement of the loudspeaker's electroacoustic transducer or cone. The invention is especially, but not exclusively, applicable to so-called "sub-woofer" loudspeakers.

BACKGROUND ART

In order to achieve satisfactory reproduction of the useful audio range, it is usual to use multi-speaker systems. In some systems, "sub-woofer" loudspeakers designed to handle the lowest frequencies, say from about 20 Hz to about 150 Hz (−3 dB points), are housed in separate enclosures and powered by their own power amplifiers. At the lower frequencies, say 20 Hz to 40 Hz, the electroacoustic transducer, usually a cone and voice coil combination, travels a significant distance, perhaps as much as one inch peak-to-peak. Non-linearities in the cone suspension system and non-uniform magnetic flux in the gap within which the voice coil travels can lead to acoustical distortion. Also, the relatively high power levels involved may introduce non-linearities due to heating of the voice coil.

It is known to compensate for these non-linearities, and equalize frequency response, by deriving a signal related to motion of the loudspeaker cone and using it to provide negative feedback to a power amplifier driving the loudspeaker. Such "servo" loudspeakers are susceptible, however, to distortion arising from overload conditions. When an overload occurs, and the loudspeaker cone reaches the limit of its range of movement, or the power amplifier "clips", unwanted high frequency components may be introduced into the loudspeaker output. This is particularly undesirable in powered sub-woofers. Low frequency signals are not considered to be localizable, so the sub-woofer speaker need not be close to the mid-range speakers and "tweeters" but may be placed anywhere in the listening area. These higher frequency units will determine the apparent position of the sound source. They may be located, for example, so as to position the sound source behind a home theater screen. High-frequency harmonics produced by "bottoming" of the loudspeaker core and/or clipping of the power amplifier may cause an apparent shifting of the sound source, which could be distracting for the listener.

The problem is particularly serious in "servo" loudspeakers because the motion sensor and feedback circuit will detect that the loudspeaker cone is not moving in proportion to the audio input signal and try to increase the amplifier gain, thereby increasing the clipping.

In servo loudspeaker systems, the amplified signal includes out-of-phase speaker non-linearities. Clipping by the amplifier would compound these non-linearities, resulting in rather unpleasant distortion of the reproduced signal.

In loudspeakers which do not use negative feedback, the gain of the power amplifier is known, so overload protection may be provided by static limiters and compressors set to appropriate levels and placed at the input of the loudspeaker drive circuitry. In the case of servo loudspeakers, however, overload protection is more complicated because sensor sensitivity, which affects closed loop gain, may vary, for a particular sensor, with temperature and time; and the rate of such variations may be different for different sensors. Moreover, the servo loop will automatically equalize the loudspeaker, resulting in different gains at different frequencies. Difficulties may also result from differences in sensitivity, frequency response and Q-factor from one loudspeaker to another from the same production line; voice coil heating increasing voice coil resistance; and lack of predictability of output peak power in view of the non-linearities in the amplitude of the amplifier signal. It is not commercially viable to design a loudspeaker unit with sufficient excess capacity that overload conditions will not occur.

SUMMARY OF THE INVENTION

The present invention seeks to eliminate, or at least mitigate, the above-mentioned disadvantages of known servo-loudspeakers. To this end, according to the present invention, a loudspeaker unit comprises an electroacoustic transducer, input means for an audio signal to be reproduced by the electroacoustic transducer, a power amplifier connected between the input means and the electroacoustic transducer, sensor means for providing a motion signal in dependence upon motion of the electroacoustic transducer, feedback means for providing a feedback signal in dependence upon the motion signal, and subtracting means connected between the input means and the power amplifier for subtracting the feedback signal from the audio signal and supplying the resulting difference signal to the power amplifier, the loudspeaker unit further comprising control means for providing a first gain control signal and a second gain control signal in response to the audio signal amplitude exceeding a first predetermined level and a second predetermined level, respectively, first variable gain amplifier means connected between the input means and the subtracting means and responsive to the first gain control signal to decrease amplification of the audio signal and second variable gain amplifier means connected within the feedback loop comprising the subtracting means, power amplifier and feedback path, the second variable gain amplifier being responsive to the second gain control signal to decrease gain within the feedback loop, the arrangement being such that the rate of change of gain of the first variable gain amplifier means in response to the audio signal exceeding the first predetermined level is significantly slower than the rate of change of gain of the second variable gain amplifier means in response to the audio signal exceeding the second predetermined level.

In a preferred embodiment, the means for providing the first and second gain control signals comprises means for deriving a signal proportional to audio signal amplitude, first deriving means for providing said first gain control signal in proportion to the difference between the proportional signal and the first threshold, and second deriving means for providing said second gain control signal in proportion to the difference between the proportional signal and the second threshold.

Each of the first and second deriving means may comprise a threshold comparison circuit and a charging circuit connected to the output of the threshold comparison circuit. The charging circuit of the second deriving means may have a charging time constant that is shorter than the charging time constant of the charging circuit of the first deriving means, and also significantly less than a period of the audio signal. The second charging circuit may have a discharging time constant significantly shorter than that of the first charging circuit.

3

Various objects, features and advantages of the invention will become apparent from the following description, taken in conjunction with the attached drawings, of an embodiment of the invention which is described by way of example only.

DESCRIPTION OF THE PREFERRED EMBODIMENT(S)

Figure 1:
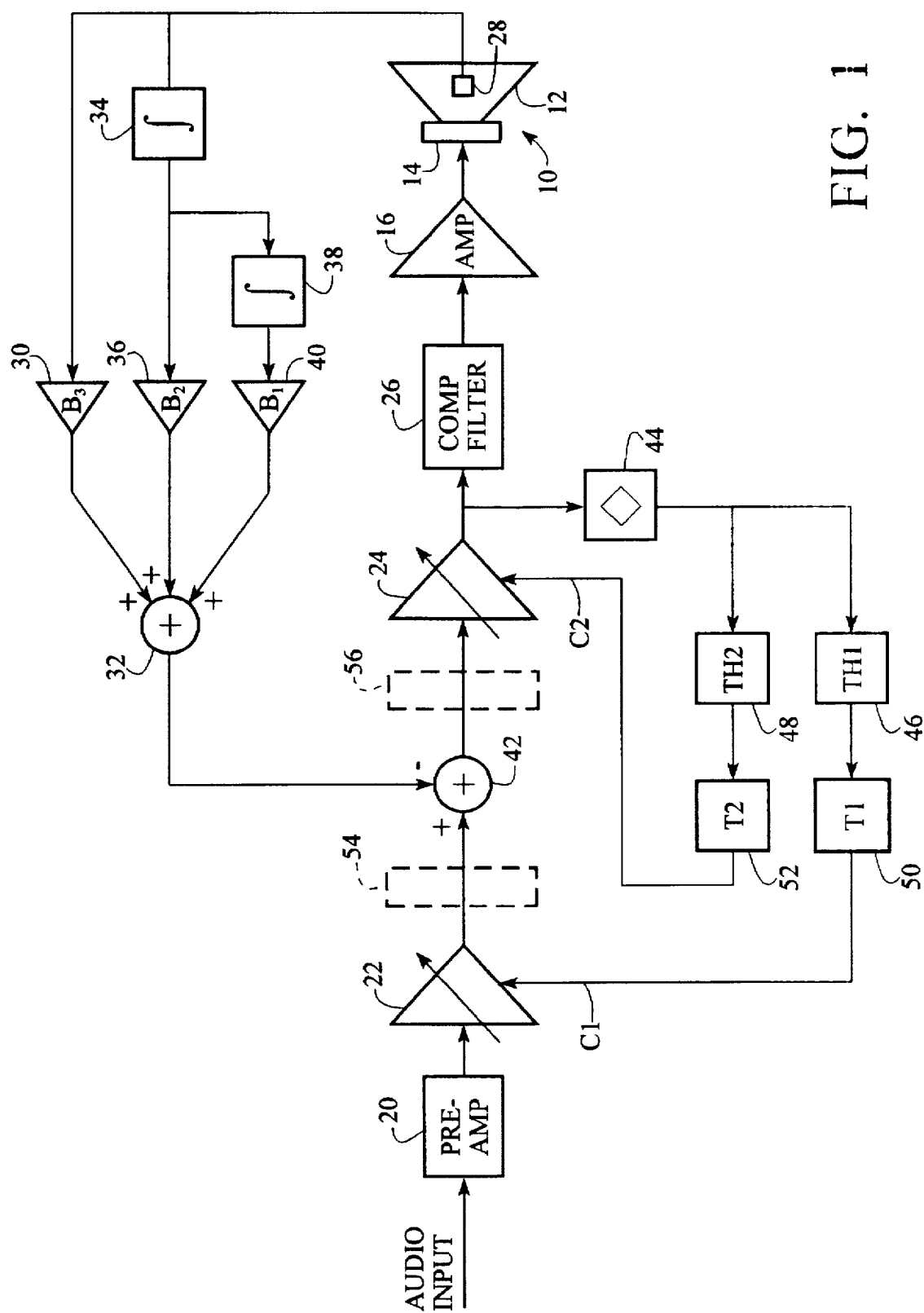
FIG. 1 is block schematic diagram of a servo-loudspeaker unit.

The powered loudspeaker unit shown in FIG. 1 comprises an electroacoustic transducer unit 10 in the form of a cone 12 driven by a voice coil (not shown) within a magnet assembly 14. The voice coil is supplied by a power amplifier 16 connected to a suitable mains power source which, for simplicity, is not shown in the drawings. An audio input signal for reproduction by the electroacoustic transducer 10 is supplied to the power amplifier 16 by way of, in succession, a preamplifier 20, a first variable gain device in the form of voltage controlled amplifier 22, a second variable gain device in the form of voltage controlled amplifier 24 and a compensation filter 26. The compensation filter 26 is of known kind with characteristics chosen so as to avoid positive feedback at some frequencies.

A motion sensor 28, for example an accelerometer, is mounted upon the voice coil 12 and derives a signal in dependence upon motion of the cone, specifically proportional to its acceleration. The cone acceleration signal is amplified by a first amplifier 30 and applied to one input of a summing device 32. A first integrator 34 integrates the cone acceleration signal to produce a cone velocity signal which is amplified by amplifier 36 and applied to a second input of the summing device 32. A second integrator 38 connected to the output of first integrator 34 integrates the cone velocity signal again to provide a cone position signal, which is amplified by a third amplifier 40 and applied to a third input of the summing device 32. Hence, the output of the summing device 32, i.e. the feedback signal, comprises three components proportional to acceleration, velocity and position, respectively.

This feedback signal is applied to a second summing device 42 connected between voltage controlled amplifiers 22 and 24, respectively. The second summing device 42 subtracts the feedback signal from the audio signal applied to the input of second voltage controlled amplifier 24 and supplies the resulting difference signal to the compensation filter 26 and thence to power amplifier 16. Hence, second voltage controlled amplifier 24 is included in the feedback loop, and controls loop gain, whereas first voltage controlled amplifier 22 precedes the feedback loop and controls the amplitude of the audio signal applied to the input of the feedback loop. The loop gain affects the amount of available gain equalization and distortion reduction.

First and second gain control signals for controlling the respective gains of voltage controlled amplifiers 22 and 24, respectively, are provided by means of a precision bridge rectifier 44 connected to the output of the second voltage controlled amplifier 24, threshold amplifiers 46 and 48 and charging circuits 50 and 52. The rectifier 44 rectifies the bipolar audio signal to produce a unipolar signal which is applied to respective inputs of first threshold amplifier 46 and second threshold amplifier 48. The outputs of threshold amplifiers 46 and 48 are applied via charging circuits 50 and 52, respectively, to first voltage controlled amplifier 22 and second voltage controlled amplifier 24, respectively. The outputs of charging circuits 50 and 52 are the first and second gain control signals C1 and C2, respectively.

The threshold levels and charging circuit time constants are set so that reduction of the gain of the first voltage controlled amplifier 22 takes place at a slower rate and begins at a lower signal amplitude than the reduction of the gain of second amplifier 24. Thus, threshold level TH1 of first threshold amplifier 46 is selected such that the output of the threshold amplifier 46 will be non-zero when the output of power amplifier 16 is more than a corresponding amplitude $V_{TH1}$ which is, say, 0.90 of clipping level, i.e. approximately $-1$ dB with respect to the amplitude at which the output of power amplifier will start clipping.

Threshold level TH2 of second threshold amplifier 48 is set such that the output of threshold amplifier 48 will be non-zero when the output of power amplifier 16 is more than a corresponding amplitude $V_{TH2}$; say 0.95 of clipping i.e. $-0.5$ dB with respect to the clipping level. These threshold values could differ so long as threshold TH2 is greater than threshold TH1.

The charging time constant or attack time T2a of charging circuit 52 is much less than the charging time constant or attack time T1a of charging circuit 50; and also much less than the period of the audio input signal. For example, for a 100 Hz. audio input signal having a period of 10 milliseconds, T2a is 100 microseconds and T1a is 75 milliseconds. As a result, the first control signal C1 will increase more slowly than second control signal C2.

The discharging time constant or release time T2r of charging circuit 52 is less than the discharging time constant T1r of charging circuit 50 and the discharging time constant or release time T1r of charging circuit 50 is greater than its own charging time constant T1a. For example, T1r may be 5 seconds and T2r may be 50 milliseconds.

Operation of the circuit will now be described with reference also to FIG. 2. When the amplitude of the audio input signal is within its normal range, such that the output $V_{amp}$ of power amplifier 16 is less than $V_{TH1}$, the output of the rectifier 44 is less than both thresholds TH1 and TH2. Consequently, both control signals C1 and C2 are zero and the gain of each of the voltage controlled amplifiers 22 and 24 is at a maximum. At point A in FIG. 2, the amplitude of the audio input signal increases suddenly to such a level that, with the gain unchanged, the corresponding output $V_{amp}$ of power amplifier 16 would exceed the clipping level. However, as the output $V_{amp}$ of power amplifier 16 exceeds the lower predetermined level $V_{TH1}$, at point B in FIG. 2, the output of rectifier 44 exceeds the threshold TH1, the output of threshold amplifier 46 increases and control signal C1 begins to increase, causing the gain of voltage controlled amplifier 22 to decrease. Because the control signal C1 changes relatively slowly, the output voltage $V_{amp}$ will continue to increase until it exceeds the level $V_{TH2}$ and the output of rectifier 44 exceeds upper threshold level TH2. At this point, designated C in FIG. 2, the second control signal C2 will increase rapidly causing the gain of second voltage controlled amplifier 24 to decrease rapidly. As a result of this rapid decrease in gain, the output $V_{amp}$ of power amplifier 16 will exceed the level $V_{TH2}$ by only a small amount, and will not reach the clipping level.

Figure 2:
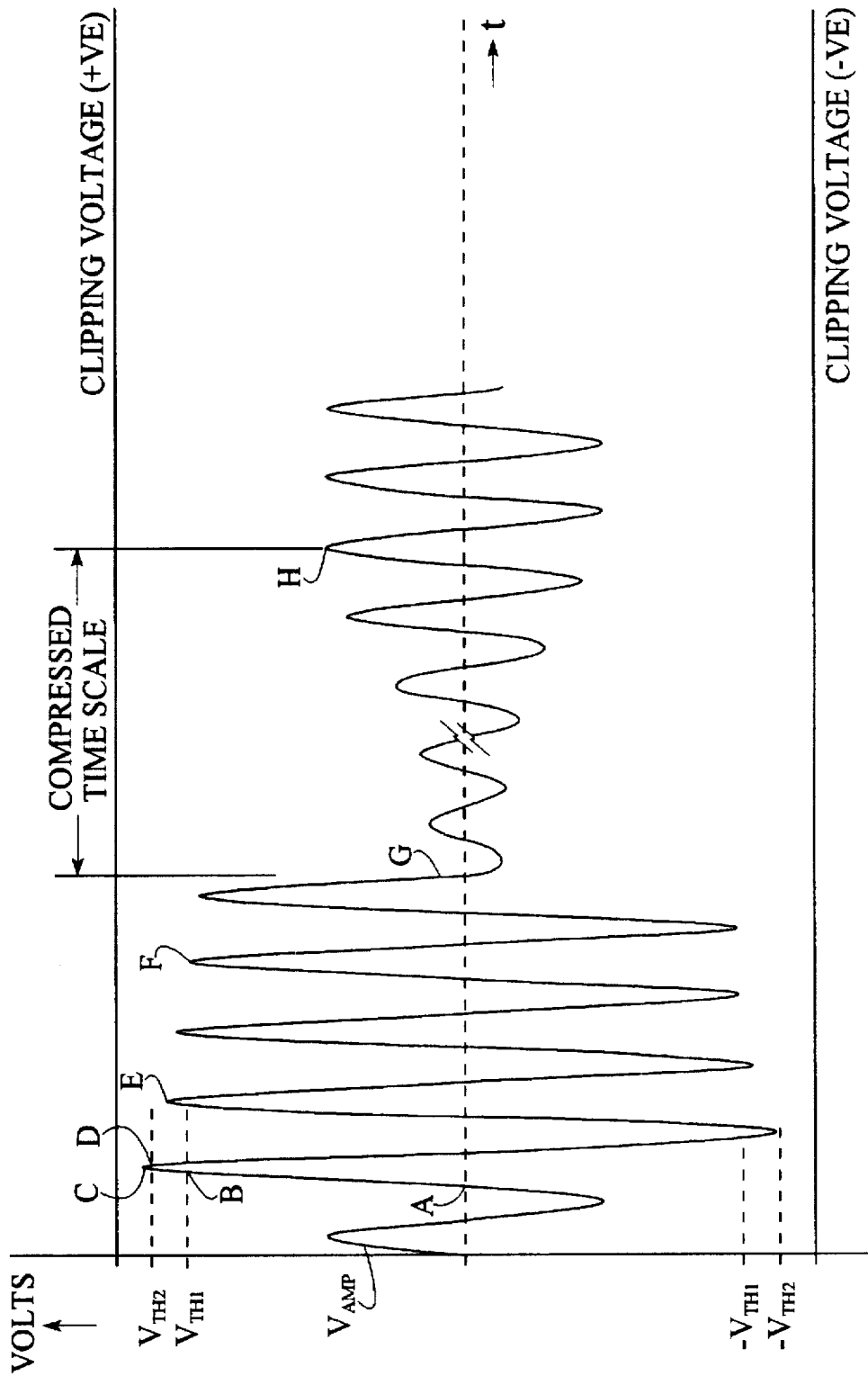
FIG. 2 illustrates a sample output waveform produced by the unit.

After an interval corresponding approximately to the charging time constant T2a of charging circuit 52, the amplitude of $V_{amp}$ falls to, about, the level $V_{TH2}$, as indicated at point D in FIG. 2, and the output of rectifier 44 falls to, about, the threshold value TH2. During this time, the gain of VCA 22 continues to decrease. A point in time is reached when the gain of VCA 22 and the gain of VCA 24 are such that $V_{amp}$ falls to just below $V_{TH2}$. Charging circuit 52 then begins to discharge, causing control signal C2 to fall rapidly and restore the gain of voltage controlled amplifier 24 to its original value, as at point E of FIG. 2. During the interval between point C and point E, which is proportional to the discharging time constant T2r of charging circuit 52 plus the charging time T1a, the level of feedback is reduced. Full feedback is restored at point E.

Because the peak amplitude of power amplifier output signal $V_{amp}$ remains above lower level $V_{TH1}$ for a few more periods of the audio signal, the gain of first voltage controlled amplifier 22 continues to decrease. The gain of voltage controlled amplifier 22 will continue to fall until $V_{amp}$ falls to about $V_{TH1}$ (point F in FIG. 2). At this point, the amplitude of the output signal $V_{amp}$ of power amplifier 16 is stable at about $V_{TH1}$ while overload conditions persist. Hence, during overload conditions, the steady-state amplitude of output signal $V_{amp}$ from power amplifier 16 is controlled by voltage controlled amplifier 22 and transient amplitudes in excess of the steady state are controlled by voltage controlled amplifier 24.

If the input signal amplitude falls to a lower level, as indicated at G in FIG. 2, the output of rectifier 44 will fall below the threshold TH1 and charging circuit 50 will begin to discharge causing control signal C1 to decrease and the gain of voltage controlled amplifier 22 to increase. In view of the relatively long discharge time constant of charging circuit 50, the power amplifier output $V_{amp}$ is only restored to normal after several periods of the audio signal, as at point H of FIG. 2.

It will be appreciated that, during the time interval between point C and point E, the output signal is not a reproduction of the input signal. Nevertheless, the overload condition is controlled without the power amplifier clipping, so distortion is reduced.

The present invention encompasses various modifications to the above-described embodiment. For example, voltage controlled amplifiers 22 and 24 could be replaced by operational transconductance amplifiers or other variable gain devices whose output/input gain, whether voltage/voltage, current/current, voltage/current or current/voltage, can be controlled by a control signal (voltage, current or other.)

It should also be appreciated that the circuit as described has been simplified to facilitate the description. As shown in broken lines in FIG. 1, other circuitry 54, such as low pass and high pass filters and buffers, might be interposed between the first variable gain element 22 and summing device 42. Also, lead/lag compensation 56, if desired, might be interposed between the summing device 42 and amplifier 24. Moreover, the two summing devices 32 and 42 could be combined into a single summing device. It would also be possible to replace rectifier 44 by two rectifiers, one between threshold amplifier 46 and charging circuit 50, the other between threshold amplifier 48 and charging circuit 52.

The rectifier 44, threshold amplifiers 46 and 48 and charging circuits 50 and 52 are shown as separate analog components, but they could be implemented digitally, using a digital signal processor (DSP), for example, in which case they would be preceded by an A-to-D converter and followed by a D-to-A converter. The components in the audio signal path could remain analog.

It is also envisaged that the components of the audio path could be implemented digitally using a DSP. This would entail inserting A-to-D converters after the preamplifier 20 and the sensor 28, respectively, and a D-to-A converter before the power amplifier 16. Of course, if the audio signal itself were digital, the A-to-D converter after the preamplifier could be omitted.

Although the above-described embodiment uses an accelerometer mounted upon the voice coil unit, the invention also encompasses loudspeaker units using other kinds of sensor, such as optical sensors.

Advantageously, motion-feedback loudspeakers embodying the present invention are less susceptible to distortion due to signal overload because the rapid-response variable gain amplifier within the feedback loop inhibits the feedback signal from exacerbating the "clipping" effect.

Although an embodiment of the invention has been described and illustrated in detail, it is to be clearly understood that the same is by way of illustration and example only and is not to be taken by way of limitation, the spirit and scope of the present invention being limited only by the appended claims.

What is claimed is:

1. A loudspeaker unit comprising an electroacoustic transducer, input means for an audio signal to be reproduced by the electroacoustic transducer, a power amplifier connected between the input means and the electroacoustic transducer, sensor means for providing a motion signal in dependence upon motion of the electroacoustic transducer, feedback means for providing a feedback signal in dependence upon the motion signal, and subtracting means connected between the input means and the power amplifier for subtracting the feedback signal from the audio signal and supplying the resulting difference signal to the power amplifier, the loudspeaker unit comprising control means for providing a first gain control signal and a second gain control signal in response to the audio signal amplitude exceeding first and second predetermined levels, respectively, the first predetermined threshold level being lower than the second predetermined threshold level, first variable gain amplifier means connected between the input means and the subtracting means and responsive to the first gain control signal to decrease amplification of the audio signal and second variable gain amplifier means connected within the feedback loop comprising the subtracting means, power amplifier and feedback path, the second variable gain amplifier being responsive to the second gain control signal to decrease gain within the feedback loop, the arrangement being such that the rate of change of gain of the first variable gain amplifier means in response to the audio signal exceeding the first predetermined level is significantly slower than the rate of change of the gain of the second variable gain amplifier means in response to the audio signal exceeding the second predetermined level.

2. A loudspeaker unit as claimed in claim 1, wherein the means for providing the first and second gain control signals comprises means for deriving a signal proportional to audio signal amplitude, first deriving means for providing said first gain control signal in proportion to the difference between the proportional signal and a first threshold, and the second deriving means for providing said second gain control signal in proportion to the difference between the proportional signal and a second threshold.

3. A loudspeaker unit as claimed in claim 1, wherein each of the first and second deriving means comprises a threshold comparison circuit and a charging circuit connected to the output of the threshold comparison circuit, the charging circuit of the second deriving means having a charging time constant that is shorter than the charging time constant of the charging circuit of the first deriving means and also significantly less than a period of the audio signal.

4. A loudspeaker unit as claimed in claim 3, wherein the second charging circuit has a discharging time constant significantly shorter than that of the first charging circuit.

* * * * *